United States Patent [19]

Hasselmark et al.

[11] Patent Number: 4,585,978
[45] Date of Patent: Apr. 29, 1986

[54] MAGNETOSTRICTIVE ACTUATOR WITH FEEDBACK COMPENSATION

[75] Inventors: Earl D. Hasselmark, Winsted; James P. Waters, Ellington; George R. Wisner, Deep River, all of Conn.

[73] Assignee: United Technologies Corporation, Hartford, Conn.

[21] Appl. No.: 678,141

[22] Filed: Dec. 4, 1984

[51] Int. Cl.[4] .............................................. H02N 2/00
[52] U.S. Cl. ...................................... 318/118; 310/26
[58] Field of Search ............................ 310/26, DIG. 3; 318/118, 254 A

[56] References Cited

U.S. PATENT DOCUMENTS

| | | | |
|---|---|---|---|
| 3,015,063 | 12/1961 | Ownby | 310/DIG. 3 |
| 3,429,155 | 2/1969 | Hines | 318/118 X |
| 3,544,867 | 12/1970 | Green | 318/118 |
| 3,857,081 | 12/1974 | Gebelein, Jr. | 318/118 X |

*Primary Examiner*—Donovan F. Duggan
*Attorney, Agent, or Firm*—J. Kevin Grogan

[57] ABSTRACT

A linear magnetostrictive actuator with feedback compensation including a force train that has at least one magnetostrictive element, an excitation component disposed on or within the actuator, a feedback apparatus whose output signal is proportional to the magnetic induction within the magnetostrictive element, and actuator control circuitry for providing the difference signal resultant between the feedback output signal and the external signal, such that positional displacement error is compensated by closed loop operation of the actuator.

6 Claims, 7 Drawing Figures

MAGNETOSTRICTIVE ACTUATOR WITH FEEDBACK COMPENSATION

DESCRIPTION

TECHNICAL FIELD

This invention relates to linear stroke actuators and more particularly to magnetostrictive linear actuators employing feedback compensation.

BACKGROUND ART

Magnetostrictive linear actuators are well known in the art; finding extensive use in sonar applications, and more recently with deformable mirrors in advanced high energy laser systems. These actuators utilize the unique properties of a select group of magnetostrictive materials whose dimensions change as a function of the intensity of an applied magnetic field. To generate linear displacements, a cylindrical rod of magnetostrictive material is located within an electrical coil. Current flow through the coil produces a magnetic induction or flux density within the rod, resulting in a change in length of the rod proportional to the magnitude of the applied field.

Most magnetostrictive materials, however, display severe hysteresis in the relationship between the applied magnetic field and the magnetostrictive displacement. Consequently, the utility of magnetostrictive devices is limited in those applications where precise control of the displacement of the actuator is required. The prior art linear magnetostrictive actuators have been capable only of open loop operation. Consequently, there still remains a significant positional error.

DISCLOSURE OF INVENTION

The object of the present invention is to provide an improved accuracy linear magnetostrictive actuator configuration with magnetoelectric feedback.

According to the present invention, a linear displacement actuator configuration responsive to an external signal includes a force train assembly having a magnetostrictive element that provides actuator displacement in response to the magnitude of an applied magnetic field, the actuator further includes feedback apparatus for providing a feedback signal indicative of the actual magnetic induction within the magnetostrictive force train. In further accord with the present invention, the linear displacement actuator configuration includes an excitation element responsive to an actuator control signal for providing the magnetic field, and actuator control circuitry for providing to the excitation element a signal whose magnitude is in proportion to the difference signal magnitude between the external signal and the feedback signal.

According to one aspect of the invention, the feedback apparatus comprises a burst generator that provides cyclical signals to the excitation element at a magnitude selected to magnetically saturate the magnetostrictive element and at a frequency higher than the control bandwidth of the feedback compensated magnetostrictive actuator configuration. The apparatus further comprises a differentiator that detects a change in the slope of the waveform of the actuator control signal that results from magnetic saturation of the magnetostrictive element in the actuator. The degree of asymmetry in the waveform of the actuator control signal is proportional to the magnitude of the magnetic induction within the magnetostrictive element. In still further accord with this aspect of the invention, the feedback apparatus includes an interval counter which accumulates positive counts during positive induction saturation, negative counts during negative induction saturation and zero counts at zero magnetic induction that provides a signal proportional to the sign and magnitude of the summed counts. Additionally included with this aspect of the invention are signal summing circuitry which provides a resultant position signal to the actuator driver electronics.

BEST MODE FOR CARRYING OUT THE INVENTION

Figure 2:
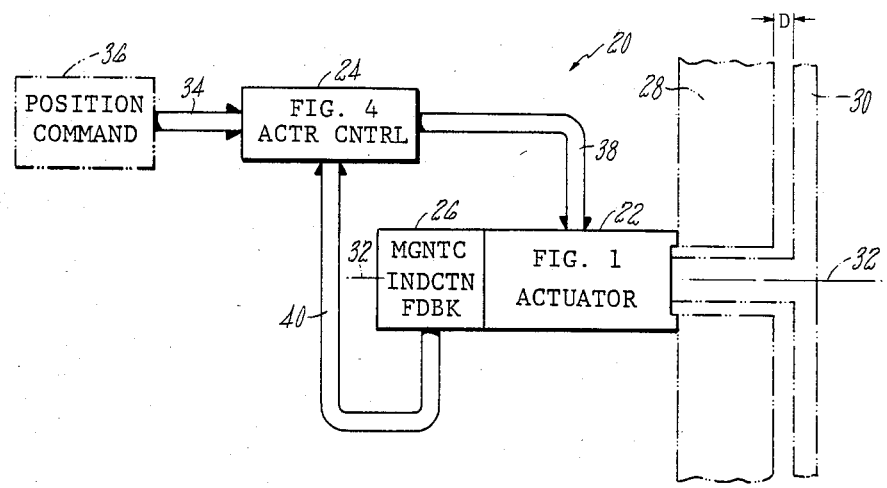
FIG. 2 is a simplified system block diagram of the feedback compensated magnetostrictive actuator configuration of the present invention.

Referring first to FIG. 2, in a simplified block diagram of the feedback compensated magnetostrictive actuator configuration 20 of the present invention, the feedback compensated magnetostrictive actuator configuration includes an actuator 22, actuator control circuitry 24, and magnetic induction feedback apparatus 26. The actuator is shown connected to an actuator mount 28 and to a load device 30, such that the load is in register with the actuator displacement axis 32.

The actuator control circuitry receives a position command signal on lines 34 from position command circuitry 36. The position command circuitry is part of the parent control system in which the feedback compensated magnetostrictive actuator may be used, and is not part of the present invention. The actuator control circuitry provides to the actuator along lines 38 an actuator control signal whose magnitude is proportional to the magnitude of the difference between the position command signal and a feedback signal provided by the feedback apparatus along lines 40. The actuator responds to the actuator control signal magnitude by producing a displacement (D) along axis 32, either extension or retraction. As a result, the load is moved linearly along the axis relative to the actuator mount.

As described hereinafter in detail with respect to FIG. 1, the magnetic induction (flux density) within the actuator can be used to provide displacement feedback.

The actuator of the present invention measures the magnetic induction within the actuator either directly or indirectly by the use of the magnetic induction feedback apparatus. The magnitude of the magnetic induction is fed back to the actuator control circuitry to enable closed loop operation of the actuator.

Figure 1:
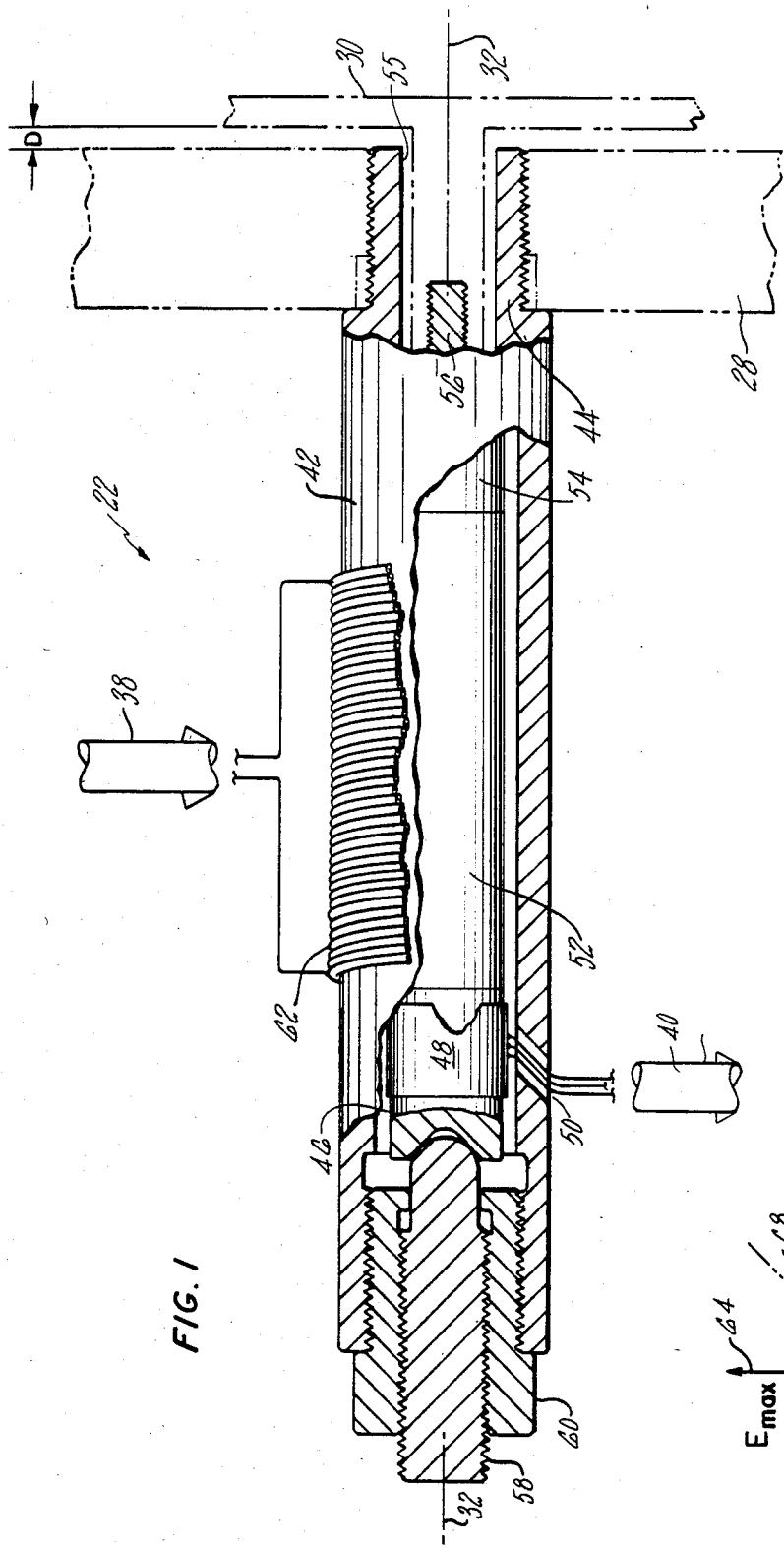
FIG. 1 is an illustration, partially in perspective and partially in section, of the best mode embodiment of a feedback compensated magnetostrictive actuator for use in the present invention.

FIG. 1 shows a view, partially in section and partially in perspective, of the actuator 22. The actuator includes a housing assembly comprising a hollow metallic cylindrical casing 42, fastened to casing locator 44 by welding or other means. The casing locator is annular with the center opening coaxial with axis 32.

Contained within the cylindrical casing and along axis 32 is a force train assembly comprising a mounting cylinder 46 fabricated from brass or from other suitable material and an induction sensor 48 which is disposed on the mounting cylinder by techniques known in the art so as to conform to the cylinder's outer surface. In the best mode, the induction sensor is a Hall Effect electromagnetic transducer, such as the Honeywell LOHET ® type 9SS linear output Hall Effect transducer. Alternatively, the induction sensor can be any equivalent sensor, such as the Siemens FP 210 magnetoresistor. The sensor functions by measuring a voltage across the surface of a conductor within the sensor generated as a result of a nonuniform carrier distribution. The nonuniform carrier condition is created by the force exerted on the carriers when positioned in a magnetic field and provides the feedback signal on lines 40 in the form of a voltage signal at a magnitude directly proportional to the magnitude of the ambient magnetic induction. Electrical leads for the induction sensor exit the casing through aperture 50 located on the side of the casing.

The force train assembly additionally includes a magnetostrictive element 52 attached by standard techniques to one end of cylinder 46. In the best mode embodiment, the element comprises a cylindrical rod of terfenol ($Tb_{0.27}$, $Dy_{0.73}$, $Fe_{1.95}$) or an iron cobalt metallic glass such as METGLAS ® 2605 Co ($Fe_{0.67}$, $Co_{0.18}$, $B_{0.14}$, $Si_{0.01}$). The other end of the magnetostrictive rod abuts permanent magnet 54, which provides to the magnetostrictive rod a bias magnetic field as hereinafter detailed in FIG. 4. Mounted to the remaining surface of the permanent magnet is a coupling means, not shown, which positions the force train to the load. The load is inserted through opening 55 in the casing locator where locating bolt 56 aligns the force train assembly with the load.

The other end of the force train assembly is located by fine adjustment bolt 58 and coarse adjustment ring 60 which are first threaded together, and subsequently threaded into the casing. The ring and bolt provide coarse and fine adjustment, respectively, of the load position along the axis.

Electrical coil 62 provides the magnetic field within the force train in response to the current component of the actuator control signal on lines 38. In the best mode embodiment, the electrical coil comprises, approximately, a 1900 turn winding of No. 26 copper wire. It is wound on the exterior of the casing, positioned so as to enclose the magnetostrictive rod. However, as known to those skilled in the art, the size and number of turns in the coil as well as the position of the electrical coil along the displacement axis is selectable to any value that produces a sufficient magnetic induction within the magnetostrictive rod to generate the desired displacement.

Additionally, the electrical coil may be located within the casing; disposed on the force train assembly. If the electrical coil is positioned within the casing, an appropriate aperture must be provided for external electrical connections. Similarly, the position of the induction sensor along the displacement axis is selectable. Any location that provides a detectable measure of the magnetic induction within the magnetostrictive rod can be used.

In operation, the position command signal is sent on lines 34 (FIG. 2) to the actuator control circuitry 24, described hereinafter in detail with respect to FIG. 4. The actuator control signal is presented in the form of a current signal on lines 38 to the electrical coil. The coil current generates the magnetic field, a portion of which is induced into the magnetostrictive rod. As known, magnetostrictive materials are stressed in an applied magnetic field and the concomitant strain produces an extension of the rod. Since the rod is fixed at one end by adjustment bolt 58, the rod's extension is manifested as a linear displacement in the direction of the load. Analytically, the displacement D can be expressed as:

$$D = HKl_c$$

where H is the magnetic field intensity, K is the strain gain constant, and $l_c$ is the quiescent length of the rod.

Magnetostrictive materials generally display a substantial hysteresis such that the relationship between the magnetizing field (H) generated by the current flow in the electrical coil, and the observed displacement (D) at the load is not single valued. This hysteresis prevents the use of conventional feedback techniques, because there is more than one value of displacement for a given value of the magnetizing field.

However, the extension of the rod (E) is proportional to the magnetic induction (B) within the rod, and consequently to the displacement (D) of the load. The single valued nature of the relationship between the magnetic induction within the rod and the magnetostrictively induced displacement results in the induction sensor signal being indicative of actual displacement, and enables closed loop operation of the actuator.

In the best mode embodiment, the magnetostrictive actuator is fabricated with the induction sensor described hereinafter, that measures the magnitude of the magnetic induction within the rod and provides a voltage indicative thereof to additional feedback apparatus hereinafter detailed in FIG. 4.

Figure 3:
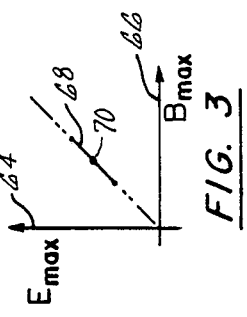
FIG. 3 is an illustration of a distinctive property of magnetostrictive materials used in the present invention.

FIG. 3 illustrates the relationship between the magnetostrictive material extension E and the magnetic induction B. The axes 64 and 66 correspond to extension and magnetic induction respectively. Curve 68 illustrates a relevant portion of the extension versus magnetic induction relationship. For certain magnetostrictive materials such as terfenol and METGLAS ®, all values of the applied field produce positive extension. The material must be biased by an applied magnetic field in order to display both extension and contraction.

In the best mode embodiment, the bias magnetic field is provided by permanent magnet 54, however any suitable alternative known to those skilled in the art may be employed. Bias point 70 represents the quiescent point established by the permanent magnet about which the actuator is operated. The magnetic field of the coil produces the desired displacement about this point.

Figure 4:
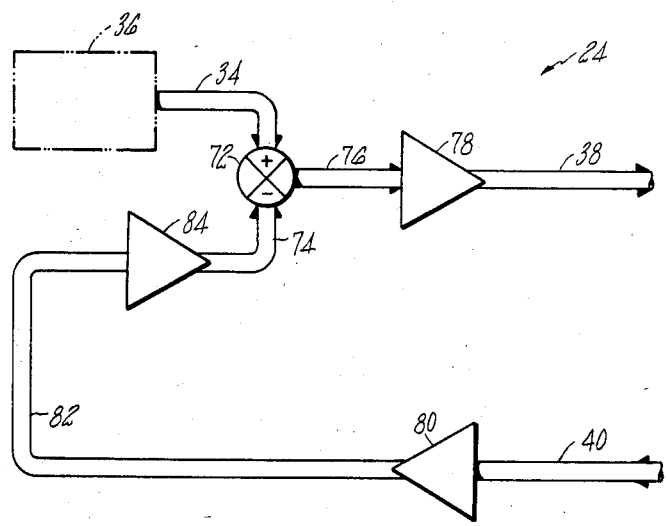
FIG. 4 is a block diagram of one element of the system diagram of FIG. 2, for use with the best mode embodiment of FIG. 1.

FIG. 4 is a block diagram of the actuator command circuitry 24 for use with the best mode embodiment.

The position command signal on lines 34 is received at summing junction 72 which receives at a second input the feedback voltage on lines 74. The junction provides the resultant position signal on lines 76 to a voltage to current converter 78. The converter used is a KEPCO No. BOP72-5M Amplifier or an equivalent amplifier configured as a current source. The actuator control signal presented on lines 38 comprises a current signal equivalent of the resultant position signal.

Induction sensor 48 (FIG. 1) provides the feedback voltage signal on lines 40 with a magnitude proportional to the magnitude of the magnetic induction within the magnetostrictive rod. The sensor signal is received by pre-amplifier 80 which amplifies the signal and provides line buffering as needed. The pre-amplifier is of a known type, such as the National Semiconductor LM301 operational amplifier. The signal output from the pre-amplifier is presented through lines 82 to amplifier 84 which provides additional amplification and signal bias adjustment. The amplifier is of a known type, such as a National Semiconductor operational amplifier No. LM301. Those skilled in the art will recognize that equivalent amplifier means can be used. The feedback signal provided by the amplifier on lines 74 to the summing junction modifies the resultant position signal, enabling closed loop operation of the actuator.

Figure 5:
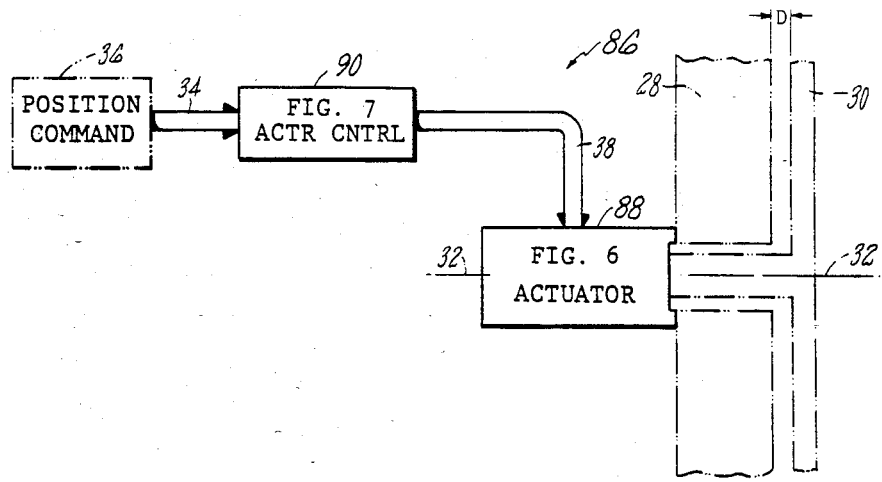
FIG. 5 is a simplified system block diagram of an alternative embodiment of the feedback compensated magnetostrictive actuator configuration of the present invention.

FIG. 5 is a block diagram of an alternative embodiment of the compensated magnetostrictive actuator configuration 86 of the present invention. Flux gate magnetometry principles are used to indirectly measure the magnitude of the magnetic induction within actuator 88. As hereinafter detailed in FIG. 7, a feedback signal proportional to the magnitude of the magnetic induction within the actuator is provided by actuator control 90. In all other aspects, the configuration of FIG. 5 is the same as that of FIG. 2.

Figure 6:
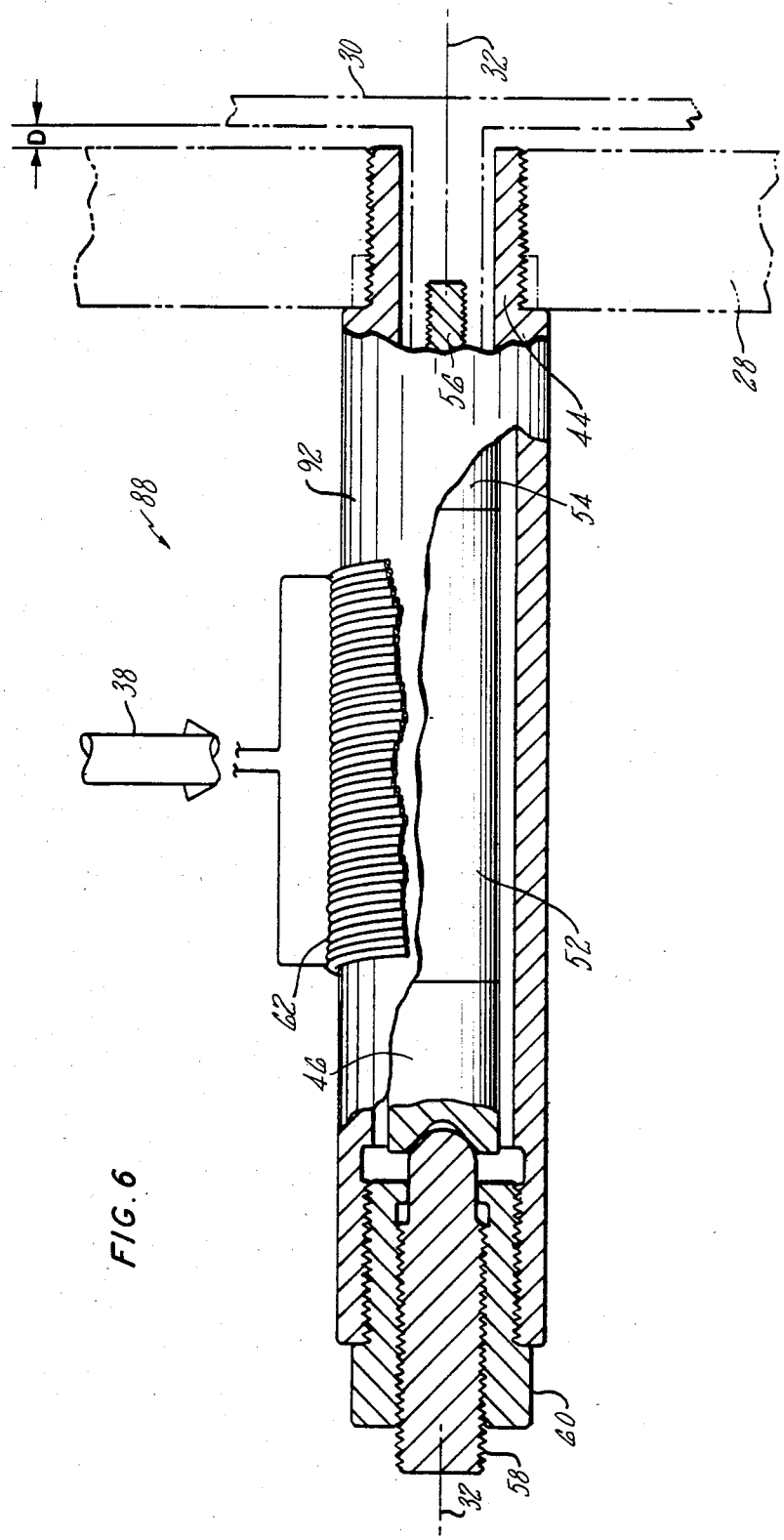
FIG. 6 is an illustration, partially in perspective and partially in section, of an alternative embodiment of a feedback compensated magnetostrictive actuator for use in the present invention.

FIG. 6 is an illustration partially in section and partially in perspective of actuator 88. The differences between the actuator of FIG. 6 and that of FIG. 1 comprise a casing 92 without an aperture and a force train without an induction sensor. In all other aspects actuator 22 (FIG. 1) and actuator 88 are identical.

Figure 7:
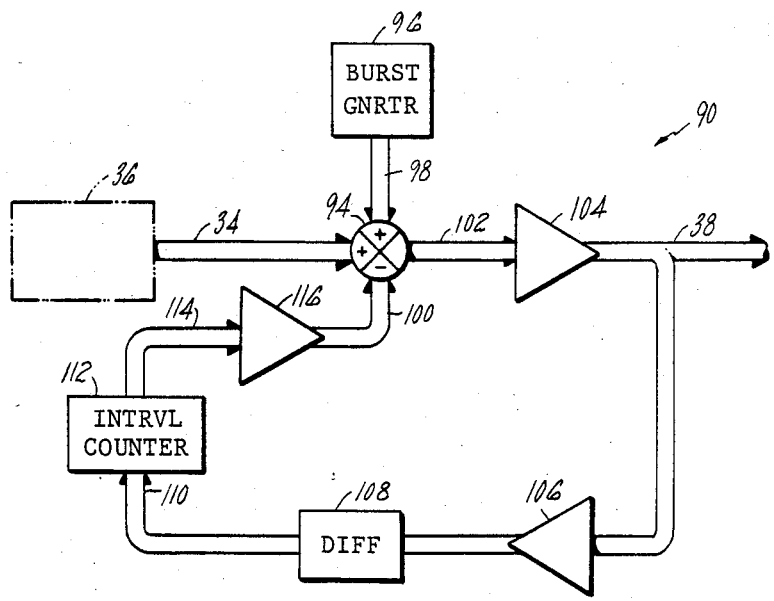
FIG. 7 is a block diagram of one element of the system diagram of FIG. 5 for use with an alternative embodiment of the feedback compensated magnetostrictive actuator configuration of the present invention.

FIG. 7 is a detailed block diagram of an alternative embodiment of an actuator control 90 for use with the present invention. Position command circuitry 36 provides the position command signal on lines 34 to summing junction 94. Burst generator 96 provides several cycles of burst pulse signals on lines 98 to the summing junction. The frequency of the burst pulse signal is at a frequency beyond the mechanical response cutoff of the force train in order to avoid perturbing the mechanical system. The magnitude of these burst pulses is chosen to be such that the magnetostrictive rod is driven symmetrically into magnetic saturation. These signals are summed with a feedback signal presented to the summing junction on lines 100. A resultant position voltage is provided on lines 102 to voltage to current converter 104, which provides an actuator control signal on lines 38 to electrical coil 62 (FIG. 1).

The voltage waveform across the electrical coil is measured across lines 38. Preamplifier 106 provides any necessary signal amplification and line buffering. In this embodiment, the preamplifier is a National Semiconductor LM301 or equivalent. The amplified signal is output from the preamplifier to differentiator 108, which detects the change in the coil voltage waveform slope resulting from saturation of the magnetic induction within the magnetostrictive rod. The degree of asymmetry in the coil voltage waveform is proportional to the magnitude magnetic induction within the core. This information is output from the differentiator along lines 110 and input to digital signal source 112. In this embodiment, the digital signal source comprises an up/down counter such as a Signetics 8284, with supporting circuitry for any requisite signal timing and digital to analog signal conversion. The counter accumulates counts during positive saturation and subtracts counts during negative saturation. A zero count will result at zero induction with a bipolar count discriminant disposed about zero induction.

The magnetic induction within the rod at any instant in time is directly related to the sign and magnitude of the counts on the counter. After any requisite digital to analog conversion, the digital signal source provides a voltage on lines 114 that corresponds to a displacement error feedback signal whose magnitude is proportional to the sign and magnitude of the counts present. Amplifier 116 performs any needed signal biasing or additional amplification and provides the feedback signal on lines 100 to the summing junction enabling closed loop operation of the actuator.

Although the embodiments of the present invention hereinbefore described, including the best mode, are configured with analog signal processing means, those skilled in the art will note that equivalent digital signal processing means may be appropriately substituted.

Similarly, although the invention has been shown and described with respect to a best mode embodiment thereof, it should be understood by those skilled in the art that various other changes, omissions and additions thereto may be made therein without departing from the spirit and scope of the invention.

We claim:

1. A magnetostrictive actuator which provides linear displacement along a displacement axis thereof in dependence on the magnitude of an external command signal, comprising:
   force train means having a magnetostrictive element for providing the linear displacement along the displacement axis in proportion to a magnetic induction (B) provided therein by an applied magnetic field (H);
   feedback sensing means disposed on said magnetostrictive element for providing a feedback signal indicative of the magnetic induction (B) within said magnetostrictive element;
   electrical coil excitation means for providing said magnetic field to said magnetostrictive element at a magnitude in dependence on the magnitude of an actuator control signal applied thereto;
   actuator control means for providing an actuator control signal to said excitation means, the magnitude of said actuator control signal being the difference of the magnitude of the external command signal and the magnitude of said feedback signal.

2. The magnetostrictive actuator of claim 1, wherein said magnetostrictive element comprises a cylindrical rod of terfenol.

3. The magnetostrictive actuator of claim 1, wherein said magnetostrictive element comprises a cylindrical rod of iron cobalt amorphous metallic glass.

4. The magnetostrictive actuator of claim 1, wherein the linear displacement of the actuator includes extension and retraction of the force train assembly at a reference displacement bias point, and wherein said force train further includes at least one permanent magnet disposed in series with said magnetostrictive element for providing therethrough a bias magnetic field for positioning the actuator at said bias point in a quiescent state, whereby said excitation means provides said magnetic field in a modulating manner to provide the actuator extension and retraction.

5. The magnetostrictive actuator of claim 1, wherein said feedback means comprises a linear output Hall Effect device responsive to said magnetic induction located such that a nonuniform electrical carrier distribution is created across a surface of said apparatus for providing a signal in proportion to the intensity of said magnetic induction within said magnetostrictive element to said driver means.

6. A magnetostrictive actuator which provides linear displacement along a displacement axis thereof in dependence on the magnitude of an external command signal, comprising:
  force train means having a magnetostrictive element for providing the linear displacement along the displacement axis in proportion to a magnetic induction (B) provided therein by an applied magnetic field (H);
  electrical coil excitation means for providing said magnetic field to said magnetostrictive element at a magnitude in dependence on the magnitude of an actuator control signal applied thereto;
  feedback sensing means for providing a feedback signal indicative of said magnetic induction (B) including,
    burst generator means for providing to said electrical coil means cyclical signals whose magnitude is chosen to magnetically saturate said magnetostrictive element;
    differentiator means responsive to changes in slope of said cyclical signals resulting from an asymmetric magnetic saturation of said magnetostrictive rod; and
    interval counter means for providing:
      detection of said asymmetric saturation in said cyclical pulses,
      conversion thereof into a digitized signal, and
      processing of said digital signal into an output analog signal whose sign and magnitude depends on the sign and magnitude of the digital signal; and
  actuator control means for providing a signal to said excitation means, the magnitude of said signal being the difference of the magnitude of the external command signal and the magnitude of said feedback signal.

* * * * *